United States Patent
Alhussien et al.

(10) Patent No.: US 9,396,807 B2
(45) Date of Patent: Jul. 19, 2016

(54) INCREMENTAL PROGRAMMING PULSE OPTIMIZATION TO REDUCE WRITE ERRORS

(71) Applicant: LSI Corporation, San Jose, CA (US)

(72) Inventors: Abdel-Hakim S. Alhussien, San Jose, CA (US); Yunxiang Wu, Cupertino, CA (US); Erich F. Haratsch, Bethlehem, PA (US)

(73) Assignee: Seagate Technology LLC, Cupertino, CA (US)

( * ) Notice: Subject to any disclaimer, the term of this patent is extended or adjusted under 35 U.S.C. 154(b) by 99 days.

(21) Appl. No.: 14/150,482

(22) Filed: Jan. 8, 2014

(65) Prior Publication Data

US 2015/0131373 A1    May 14, 2015

Related U.S. Application Data

(60) Provisional application No. 61/902,380, filed on Nov. 11, 2013.

(51) Int. Cl.
| | |
|---|---|
| *G11C 11/34* | (2006.01) |
| *G11C 16/34* | (2006.01) |
| *G11C 11/56* | (2006.01) |
| *G11C 16/04* | (2006.01) |

(52) U.S. Cl.
CPC ........ *G11C 16/3431* (2013.01); *G11C 11/5628* (2013.01); *G11C 16/0483* (2013.01); *G11C 16/349* (2013.01); *G11C 16/3459* (2013.01); *G11C 16/3404* (2013.01)

(58) Field of Classification Search
CPC ............... G11C 16/10; G11C 11/5628; G11C 13/0069; G11C 16/3495; G11C 2013/0092; G11C 11/1675; G11C 29/44

USPC ............ 365/185.02, 185.03, 185.23, 185.24, 365/129, 174, 189.011, 230.06

See application file for complete search history.

(56) References Cited

U.S. PATENT DOCUMENTS

| | | | |
|---|---|---|---|
| 8,441,861 B2 | 5/2013 | Spessot et al. | |
| 8,451,662 B2 | 5/2013 | Visconti et al. | |
| 8,806,111 B2 * | 8/2014 | Whitney | 711/103 |
| 8,934,298 B2 * | 1/2015 | Park et al. | 365/185.03 |
| 9,077,383 B2 * | 7/2015 | Murakami | |
| 2008/0019180 A1 * | 1/2008 | Wan et al. | 365/185.17 |
| 2011/0194346 A1 * | 8/2011 | Yoon et al. | 365/185.03 |
| 2012/0224430 A1 * | 9/2012 | Visconti et al. | 365/185.19 |
| 2013/0060994 A1 * | 3/2013 | Higgins et al. | 711/103 |
| 2015/0078093 A1 * | 3/2015 | Hahn et al. | 365/185.19 |

FOREIGN PATENT DOCUMENTS

KR    1020130110646    * 9/2013

* cited by examiner

*Primary Examiner* — Fernando Hidalgo
(74) *Attorney, Agent, or Firm* — Suiter Swantz pc llo

(57) ABSTRACT

In a data storage system having multi-level memory cells, a counter tracks the number of program/erase cycles, anticipated read cycles, or anticipated length of data retention of a cell. When a threshold number of cycles is reached or length of retention or read frequency are anticipated, the cell is programmed using more program voltage pulses, narrower program voltage pulses or some other modification to the incremental step programming pulse to reduce the range where the intermediate least significant (lower) bit read voltage may be erroneous, thereby reducing the probability of write errors when the most significant page (upper) is programmed.

17 Claims, 4 Drawing Sheets

INCREMENTAL PROGRAMMING PULSE OPTIMIZATION TO REDUCE WRITE ERRORS

PRIORITY

The present application claims the benefit under 35 U.S.C. §119(e) of U.S. Provisional Application Ser. No. 61/902,380, filed Nov. 11, 2013, which is incorporated herein by reference.

FIELD OF THE INVENTION

The present invention is directed generally toward multi-level memory cells, and more particularly to processes for programming multi-level memory cells under certain conditions.

BACKGROUND OF THE INVENTION

Multi-level memory cells are widely used as the basic storage units in flash memory. Multi-level memory cells are capable of storing four different cell levels corresponding to two bits. Programming the states of a multi-level memory cell is a two phase process, in which the least significant bit page is written, putting the cells into an intermediate state reflecting the value of the least significant bit. Next the noisy least significant bit page is read before both the least significant bit and most significant bit pages are written, putting the cells in the final target states before the next erase. The least significant bit and most significant bit are written independently to maintain high write/read throughput; the least significant bit page is not stored after writing to flash because the most significant bit page might not be available immediately afterwards for writing. The most significant bit page is written based on the read least significant bit page, without passing the least significant bit through an error correcting code first; therefore the final programmed state maybe in error because of the rough distribution of the intermediate state 'x0', where the left tail of the distribution intersects with state '11' after many program/erase cycles, or after significant data retention. The least significant bit read process affects write throughput, and so is latency critical; therefore the noisy least significant bit read is not corrected before writing the final state.

Consequently, it would be advantageous if an apparatus existed that is suitable for reliably distinguishing the intermediate and erase cell states after many program/erase cycles, read cycles, or long data retention.

SUMMARY OF THE INVENTION

Accordingly, the present invention is directed to a novel method and apparatus for reliably distinguishing the intermediate least significant bit state and the erase cell state after many program/erase cycles, read cycles, or long data retention.

In at least one embodiment of the present invention, a counter tracks the number of program/erase cycles of a cell. When a threshold number of cycles is reached, the cell is programmed using more program voltage pulses to increase the target threshold voltage of the least significant bit and reduce the probability of erroneous read.

In at least one embodiment of the present invention, for applications where long data retention is anticipated, such as when a block is programmed with cold data that is rarely accessed, the cell is programmed using more program voltage pulses to increase the target threshold voltage of the least significant bit and reduce the probability of erroneous read. Also if many read cycles are anticipated before the data is refreshed, such as in archive storage, then a similar approach is implemented to increase the target threshold voltage of the intermediate least significant bit.

In at least one embodiment of the present invention, a counter tracks the number of program/erase cycles of a cell. When a threshold number of cycles is reached, the cell is programmed using narrower program voltage pulses to achieve a more precise intermediate state of the least significant bit, then, this would reduce the tail of the noise distribution of that state and reduce the probability of an erroneous hard read.

In at least one embodiment of the present invention, for applications where long data retention is anticipated, such as when a block is programmed with cold data that is rarely accessed, the cell is programmed using narrower program voltage pulses to achieve a more precise intermediate state of the least significant bit, reducing the tail of the noise distribution of that state and reducing the probability of an erroneous hard read. Also if many read cycles are anticipated before the data is refreshed, such as in archive storage, then a similar approach is implemented to reduce the tail of the noise distributions of the target intermediate least significant bit.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the subject matter disclosed, which is illustrated in the accompanying drawings. The scope of the invention is limited only by the claims; numerous alternatives, modifications and equivalents are encompassed. For the purpose of clarity, technical material that is known in the technical fields related to the embodiments has not been described in detail to avoid unnecessarily obscuring the description.

Figure 1:
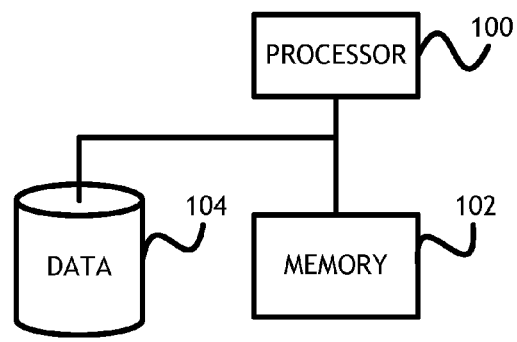
FIG. 1 shows a block diagram of a computer apparatus useful for implementing embodiments of the present invention.

Referring to FIG. 1, a block diagram of a computer apparatus useful for implementing embodiments of the present invention is shown. In at least one embodiment of the present invention, a computer apparatus includes a processor 100 connected to a memory 102 comprising at least one multi-level memory cell. In at least one embodiment, the processor 100 is also connected to a data storage element 104 such as a hard disk drive or solid state drive, where the data storage element 104 is configured to store data after encoding it with an error correction code, such as a low density parity check code.

The processor 100 is configured to execute computer executable program code. The processor 100 writes data to a group of multi-level memory cells in the memory 102 organized as pages, blocks, or in any other form. In at least one embodiment, the processor 100 tracks the number of program/erase cycles of the multi-level memory block, page, or any other granularity. In at least one embodiment, tracked properties are stored in the processor 100. Based on the number of program/erase cycles that the device has clocked, the processor 100 alters the number or width of voltage pulse cycles used to program the multi-level page, block, or any other granularity.

The processor 100 can keep track of cold memory data that is not accessed often, which can be subject to data retention degradation, the processor 100 then alters the number or width of voltage pulse cycles used to program the multi-level page, block, or any other granularity in anticipation for the resulting narrow margin between the erase and intermediate least significant bit distributions. This is especially relevant for partially programmed blocks or group of blocks, as some considerable time can lapse between programming the least significant page and the collocated upper page on the same wordline. The processor 100 needs to know in advance by some mechanism that the data will be of this type so that the least significant pages are programmed with the modified incremental programming procedure described herein.

The processor 100 can adjust its incremental programming procedure for data that is written once and re-read frequently before its refreshed again. This is especially the case for archive type data. As frequent read cycles can degrade the data, the processor 100 then alters the number or width of voltage pulse cycles used to program the multi-level page, block, or any other granularity in anticipation for the resulting narrow margin between the erase and intermediate least significant bit distributions. This is especially relevant for partially programmed blocks or group of blocks, as some considerable reads can happen between programming the least significant page and the collocated upper page on the same wordline. The processor 100 needs to know in advance by some mechanism that the data will be of this type so that the least significant pages are programmed with the modified incremental programming procedure described herein.

Figure 2A:
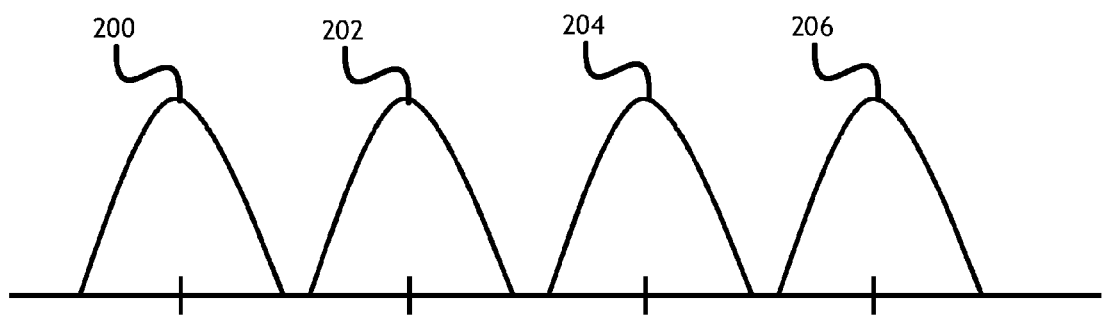
FIG. 2A shows a representation of four potential cell voltage levels of a multi-level memory cell.
Figure 2B:
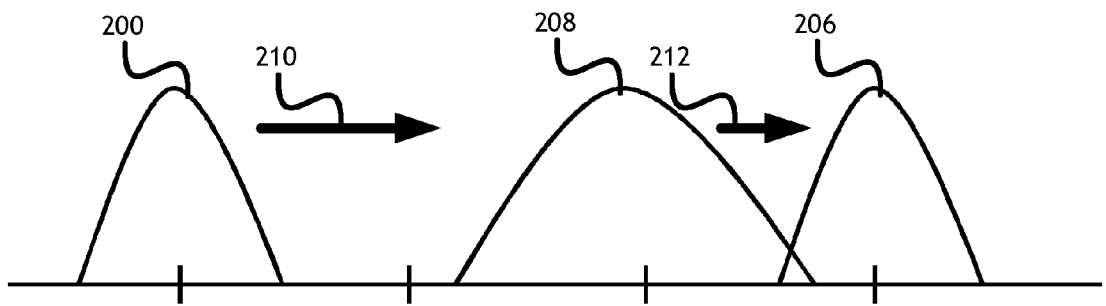
FIG. 2B shows a representation of voltage levels of a multi-level memory cell during programming.

Referring to FIGS. 2A and 2B, representations of four potential cell voltage levels, and voltage levels during programming, of a multi-level memory cell are shown. The multi-level memory cell ideally has four distinct potential voltage levels 200, 202, 204, 206; a first level 200 representing (1,1), a second level 202 representing (0,1), a third level 204 representing (0,0) and a fourth level 206 representing (1,0). During programming the bits (1,0) in one exemplary embodiment, the multi-level cell is programmed 210 from the first level 200 erasure state to an intermediate level 208 state representing only the least significant bit. The cell is then programmed 212 by reading the intermediate level 208 and applying the most significant bit to produce the final fourth level 206 program state. Write errors occur when a cell is programmed to a state which is different from the intended state because the least significant bit is misread or otherwise corrupted before writing the most significant bit. When write errors occur, a cell can be corrupted in two possible ways: cell states may be confused between the first level 200 (1,1) and fourth level 206 (1,0), and cell states may be confused between the second level 204 (0,1) and third level 204 (0,0). Write errors can cause a digital signal processor to generate incorrect log-likelihood ratios that increase the probability of soft low-density parity-check decoding failures. Embodiments of the present invention prevent write errors.

Figure 3:
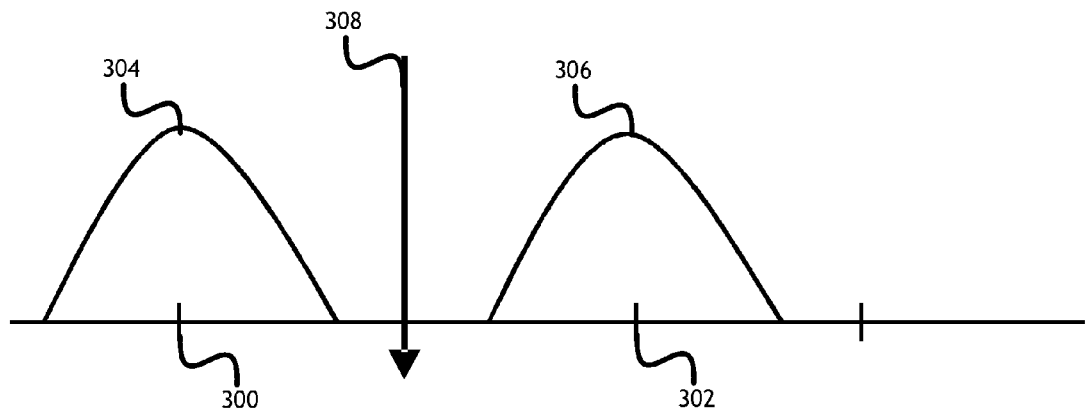
FIG. 3 shows an idealized representation of voltage distribution ranges for reading states of a least significant bit in a multi-level cell.

Referring to FIG. 3, an idealized representation of voltage noise distribution ranges for reading states of an intermediate least significant bit in a multi-level cell is shown. In a new multi-level memory cell, while in an intermediate programming state, the least significant bit of the multi-level memory cell has two potential states 300, 302. A first state 300 has a first state program voltage distribution 304 representing a symbol '1', where the programmed multi-level cell may have any voltage within the first state program voltage distribution 304 during normal programming. Likewise, the second state 302 representing a symbol '0', has a second state program voltage distribution 306 where the programmed multi-level cell may have any voltage within the second state program voltage distribution 306 during normal programming. A multi-level memory cell is programmed by applying voltage pulses.

The multi-level memory cell, and in particular the least significant bit of the multi-level memory cell, is read at a particular tracking voltage 308. The tracking voltage 308 can be adjusted to minimize the risk of erroneously reading and re-writing the wrong state when the upper page is programmed.

The intermediate state has a rough distribution because of the wide step size used in incremental step pulse programming to write the intermediate least significant bit, which is used to achieve fast programming of the intermediate least significant bit page and reduce the overall latency of programming.

Programming to a wrong state causes write errors with large magnitude log-likelihood ratio of the wrong sign at the input of the low-density parity-check code. Such errors greatly degrade the performance of a low-density parity-check code in the error floor region and need to be avoided even if a throughput cost is inevitable.

Figure 4:
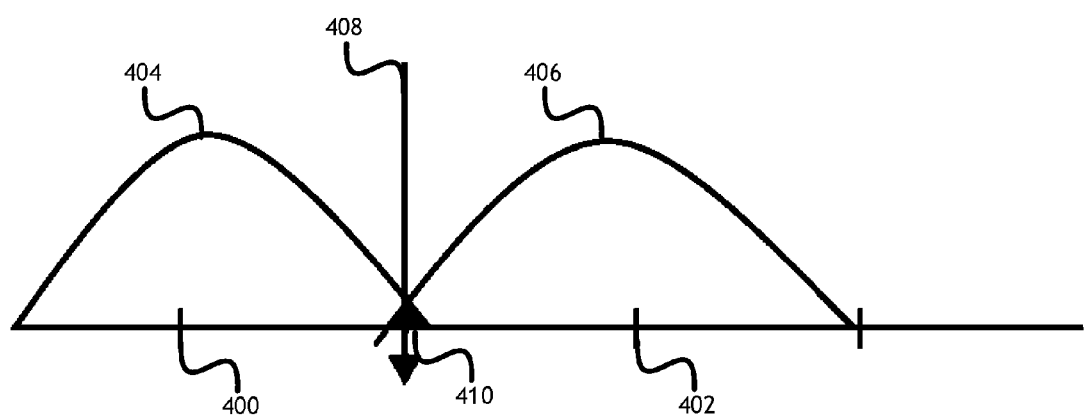
FIG. 4 shows a representation of voltage distribution ranges for reading states of an intermediate least significant bit in a multi-level cell.

Referring to FIG. 4, a representation of voltage distribution ranges for reading states of a least significant bit in a multi-level cell is shown. In a multi-level memory cell, the intermediate least significant bit of the multi-level memory cell has two potential states 400, 402. A first state 400 has a first state program voltage distribution 404 where the programmed multi-level cell may have any voltage within the first state program voltage distribution 404 during normal programming. Likewise, the second state 402 has a second state program voltage distribution 406 where the programmed multi-level cell may have any voltage within the second state program voltage distribution 406 during normal programming.

The multi-level memory cell, and in particular the least significant bit of the multi-level memory cell, is read at a particular tracking voltage 408. The tracking voltage 408 can be adjusted to minimize the risk of erroneously reading and re-writing the wrong state when the upper page is programmed.

As a multi-level memory cell undergoes repeated usage, program voltage distributions 404, 406 change and widen to encompass a wider range of potential voltages. At a certain point, the program voltage distributions 404, 406 will overlap to form an ambiguous region 410 where the tracking voltage 408 cannot distinguish between states 400, 402. If the ambiguous region 410 remains small, the probability of a read error is negligible.

Figure 5:
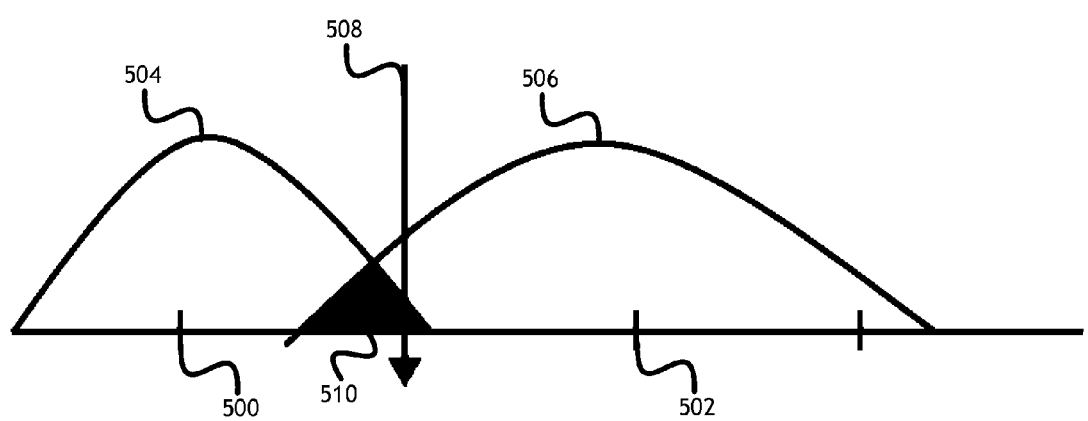
FIG. 5 shows a representation of voltage distribution ranges for reading states of an intermediate least significant bit in a multi-level cell after numerous program/erase cycles, numerous read cycles, or long data retention.

Referring to FIG. 5, a representation of voltage distribution ranges for reading states of an intermediate least significant bit in a multi-level cell after numerous program/erase cycles, numerous read cycles, or long data retention is shown. In a multi-level memory cell, the intermediate least significant bit of the multi-level memory cell has two potential states 500, 502. A first state 500 has a first state program voltage distribution 504 where the programmed multi-level cell may have any voltage within the first state program voltage distribution 504 during normal programming. Likewise, the second state 502 has a second state program voltage distribution 506 where the programmed multi-level cell may have any voltage within the second state program voltage distribution 506 during normal programming.

The multi-level memory cell, and in particular the least significant bit of the multi-level memory cell, is read at a particular tracking voltage 508. The tracking voltage 508 can be adjusted to minimize the risk of erroneously reading and re-writing the wrong state when the upper page is programmed.

As program voltage distributions 504, 506 widen to encompass a wider range of potential voltages, the ambiguous region 510 widens to the point where the tracking voltage 508 cannot distinguish between states 500, 502. Furthermore, no change to the tracking voltage 508 can adequately account for the ambiguous region 510, as the ambiguous region is growing due to growing noise variance in addition to noise mean shift, and the tracking voltage 508 can account only to the sift of the means 500 and 502. Thus, perturbations in the tracking voltage 508 do not improve the raw bit error rate further; therefore, write errors will be the dominant source of the low-density parity-check code in the error floor if the growth of this ambiguous region is not prevented.

Figure 6:
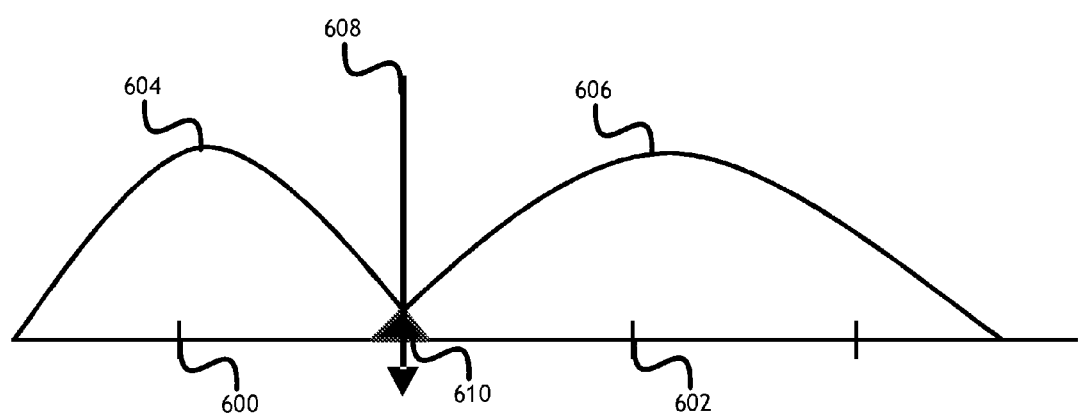
FIG. 6 shows a representation of voltage distribution ranges for reading states of an intermediate least significant bit in a multi-level cell after numerous program/erase cycles, numerous read cycles, or long data retention, programmed according to one embodiment of the present invention.

Referring to FIG. 6, a representation of voltage distribution ranges for reading states of an intermediate least significant bit in a multi-level cell after numerous program/erase cycles, numerous read cycles, or long data retention, programmed according to one embodiment of the present invention is shown. In a multi-level memory cell, the intermediate least significant bit of the multi-level memory cell has two potential states 600, 602. A first state 600 has a first state program voltage distribution 604 where the programmed multi-level cell may have any voltage within the first state program voltage distribution 604 during normal programming. Likewise, the second state 602 has a second state program voltage distribution 606 where the programmed multi-level cell may have any voltage within the second state program voltage distribution 606 during normal programming.

The multi-level memory cell, and in particular the least significant bit of the multi-level memory cell, is read at a particular tracking voltage 608. The tracking voltage 608 can be adjusted to minimize the risk of erroneously reading and re-writing the wrong state when the upper page is programmed.

By applying more programming pulses to the multi-level memory cell during programming, the second state program voltage distribution 606 is shifted along the continuum of potential voltages from 602 to the higher target voltage 603. Shifting the second state program voltage distribution 606 effectively reduces the ambiguous region 610 so that tracking voltage 608 adjustments can be more effective in accounting for the ambiguous region 610, reducing the bit error rate.

Figure 7:
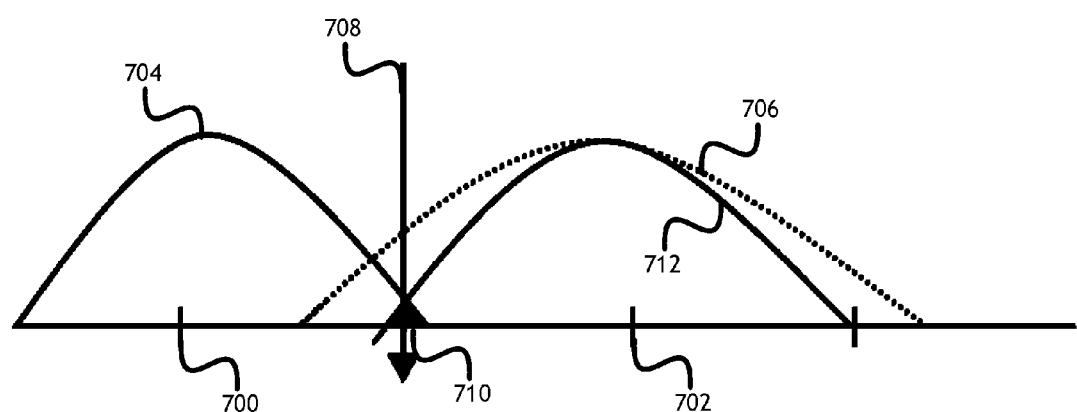
FIG. 7 shows a representation of voltage distribution ranges for reading states of an intermediate least significant bit in a multi-level cell after numerous program/erase cycles, numerous read cycles, or long data retention, programmed according to one embodiment of the present invention.

Referring to FIG. 7, a representation of voltage distribution ranges for reading states of an intermediate least significant bit in a multi-level cell after numerous program/erase cycles, numerous read cycles, or long data retention, programmed according to one embodiment of the present invention is shown. In a multi-level memory cell, the least significant bit of the multi-level memory cell has two potential states 700, 702. A first state 700 has a first state program voltage distribution 704 where the programmed multi-level cell may have any voltage within the first state program voltage distribution 704 during normal programming. Likewise, the second state 702 has a second state program voltage distribution 706 where the programmed multi-level cell may have any voltage within the second state program voltage distribution 706 during normal programming.

The multi-level memory cell, and in particular the intermediate least significant bit of the multi-level memory cell, is read at a particular tracking voltage 708. The tracking voltage 708 can be adjusted to minimize the risk of erroneously reading and re-writing the wrong state when the upper page is programmed.

By applying narrower programming pulses, smaller magnitude programming pulses or a slower ramp of pulse amplitudes to the multi-level memory cell during programming, the second state program voltage distribution 706 is narrowed 712. Narrowing 712 the second state program voltage distribution 706 effectively reduces the ambiguous region 710 so that tracking voltage 708 adjustments can adequately account for the ambiguous region 710, reducing the bit error rate.

Figure 8:
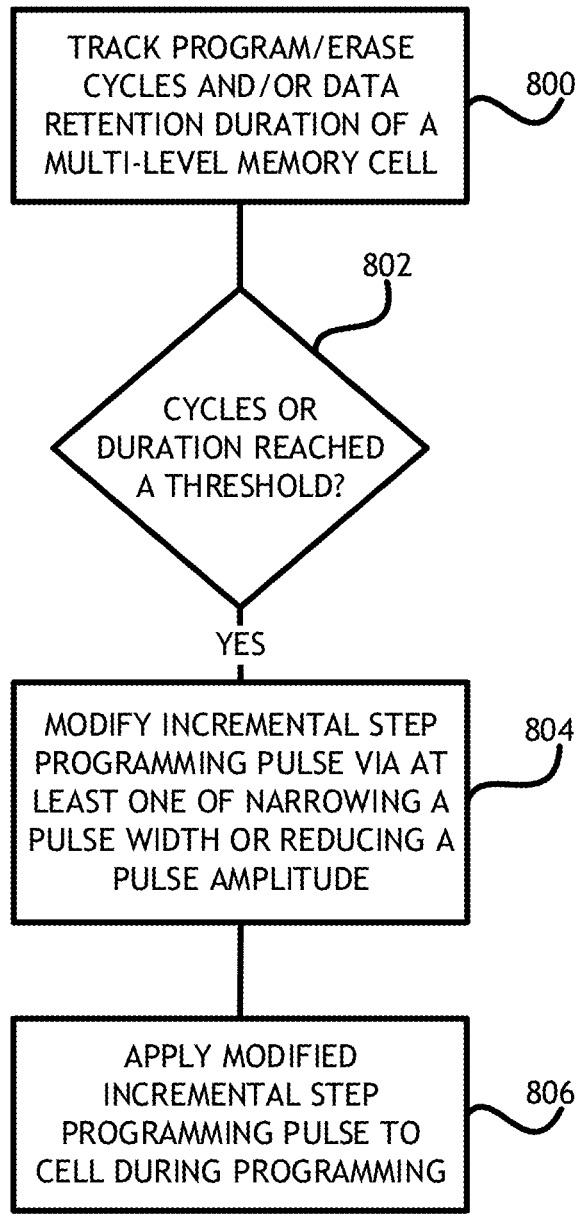
FIG. 8 shows a flowchart of a method for programming multi-level cells according to embodiments of the present invention.

Referring to FIG. 8, a flowchart of a method for programming multi-level cells according to embodiments of the present invention is shown. In at least one embodiment, a processor programming a multi-level memory cell tracks 800 the number of program/erase cycles, or has advance knowledge of duration of data retention or read frequency for a group of multi-level memory cells organized in pages, blocks, or any other granularity. If the number of cycles or anticipated retention duration or read cycles exceed 802 some threshold defined for the multi-level memory cells, where tracking voltage perturbations are no longer able to improve the raw bit error rate further, the processor modifies 804 some feature of the incremental step programming pulse used to program the multi-level memory cell. In at least one embodiment, the incremental step programming pulse is narrowed; in another embodiment, the incremental step programming pulse has a smaller amplitude; in another embodiment, the incremental step programming pulse has a slower ramp of pulse magnitudes; in another embodiment, the incremental step programming pulse is modified to apply more pulses.

Once the incremental step programming pulse is modified, the pulse is applied to the multi-level memory cell. Modified incremental step programming pulses increase latency in programming, therefore, it is only advantageous to apply such modified incremental step programming pulses toward the end of a multi-level memory's life after many program/erase cycles are clocked, for cold data where data retention issues arise, or for archive type data where many read cycles are anticipated before the data is refreshed. Embodiments of the present invention modify voltage distributions of the intermediate state of a multi-level memory cell at the end of life for the cell, for cold data, for archive data, or for all of these scenarios combined, and thereby reduce the incidence of write errors.

It is believed that the present invention and many of its attendant advantages will be understood by the foregoing description of embodiments of the present invention, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A data storage system comprising:
   a processor;
   memory connected to the processor, the memory comprising a plurality of multi-level memory cells;
   a data storage element connected to the processor; and
   computer executable program code configured to execute on the processor,
   wherein the computer executable program code is configured to:
      identify a first multi-level cell in the plurality of multi-level cells as being prone to write errors;
      modify an incremental step programming pulse via applying more pulses to shift a mean voltage distribution associated with a least significant bit; and
      apply the modified incremental step programming pulse to the first multi-level memory cell.

2. The system of claim 1, wherein:
   the computer executable program code is further configured to track a program/erase cycle count associated with the first multi-level memory cell; and
   identifying that the first multi-level memory cell is prone to write errors comprises identifying that the program/erase cycle count has exceeded a count threshold.

3. The system of claim 1, wherein:
   the computer executable program code is further configured to anticipate at least one of a data retention duration and a number of read cycles associated with the first multi-level memory cell; and
   identifying that the first multi-level memory cell is prone to write errors comprises identifying that the data retention duration has exceeded at least one of a duration threshold and a read frequency threshold.

4. The system of claim 1, wherein modifying the incremental step programming pulse further comprises narrowing a pulse width to increase precision of programming.

5. The system of claim 1, wherein modifying the incremental step programming pulse further comprises reducing a pulse amplitude to increase precision of programming.

6. The system of claim 1, wherein modifying the incremental step programming pulse further comprises slowing a ramp-up of pulse magnitudes to increase precision of programming.

7. The system of claim 1, wherein the computer executable program code is further configured to:
   identify a second multi-level cell in the plurality of multi-level cells, such second multi-level cell not prone to write errors;
   apply a standardized incremental step programming pulse to the first multi-level memory cell.

8. A method for programming multi-level memory cells comprising:
   identifying a first multi-level cell as being prone to write errors;
   modifying an incremental step programming pulse via applying more pulses to shift a mean voltage distribution associated with a least significant bit; and
   applying the modified incremental step programming pulse to the first multi-level memory cell.

9. The method of claim 8, further comprising tracking a program/erase cycle count associated with the first multi-level memory cell,
   wherein identifying that the first multi-level memory cell is prone to write errors comprises identifying that the program/erase cycle count has exceeded a count threshold.

10. The method of claim 8, further comprising anticipating at least one of a data retention duration and a number of read cycles associated with the first multi-level memory cell,
    wherein identifying that the first multi-level memory cell is prone to write errors comprises identifying that at least one of the data retention duration and the number of read cycles has exceeded a threshold.

11. The method of claim 8, wherein modifying the incremental step programming further pulse comprises narrowing a pulse width to increase precision of programming.

12. The method of claim 8, wherein modifying the incremental step programming pulse further comprises reducing a pulse amplitude to increase precision of programming.

13. The method of claim 8, wherein modifying the incremental step programming pulse further comprises slowing a ramp-up of pulse magnitudes to increase precision of programming.

14. A low-density parity-check decoder comprising:
    a processor;
    memory connected to the processor, the memory comprising a plurality of multi-level memory cells; and
    computer executable program code,
    wherein the computer executable program code is configured to:
       track a program/erase cycle count;
       anticipate at least one of a data retention duration and a number of read cycles associated with the first multi-level memory cell;
       identify a first multi-level cell in the plurality of multi-level cells as being prone to write errors based on the program/erase cycle count, the data retention duration and a read frequency exceeding a threshold;
       modify an incremental step programming pulse via applying more pulses to shift a mean voltage distribution associated with a least significant bit; and
       apply the modified incremental step programming pulse to the first multi-level memory cell.

15. The low-density parity-check decoder of claim 14, wherein modifying the incremental step programming pulse further comprises narrowing a pulse width to increase precision of programming.

16. The low-density parity-check decoder of claim 14, wherein modifying the incremental step programming pulse further comprises reducing a pulse amplitude to increase precision of programming.

17. The low-density parity-check decoder of claim 14, wherein modifying the incremental step programming pulse further comprises slowing a ramp-up of pulse magnitudes to increase precision of programming.

* * * * *